United States Patent
Bassi et al.

(10) Patent No.: US 11,079,415 B2
(45) Date of Patent: Aug. 3, 2021

(54) PEAK DETECTOR CALIBRATION

(71) Applicant: Infineon Technologies AG, Neubiberg (DE)

(72) Inventors: Matteo Bassi, Villach (AT); Giovanni Boi, Villach (AT); Dmytro Cherniak, Villach (AT); Fabio Padovan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 193 days.

(21) Appl. No.: 16/520,978

(22) Filed: Jul. 24, 2019

(65) Prior Publication Data

US 2021/0025924 A1    Jan. 28, 2021

(51) Int. Cl.
  *H03L 5/00*    (2006.01)
  *H03B 5/12*    (2006.01)
  *G01R 19/04*   (2006.01)

(52) U.S. Cl.
  CPC .......... *G01R 19/04* (2013.01); *H03B 5/1234* (2013.01); *H03B 5/1271* (2013.01); *H03L 5/00* (2013.01)

(58) Field of Classification Search
  CPC . G01R 19/04; H03B 5/04; H03B 5/12; H03B 5/1234; H03B 5/1265; H03B 5/1271; H03B 5/1278; H03B 2200/0046; H03B 2200/009; H03B 2201/031; H03L 5/00; H03L 5/02
  See application file for complete search history.

(56) References Cited

U.S. PATENT DOCUMENTS

| | | | | |
|---|---|---|---|---|
| 2008/0238559 A1* | 10/2008 | Kuwano | ............... | H03B 5/1212 331/109 |
| 2008/0266011 A1* | 10/2008 | Kuosmanen | ............ | H03L 7/099 331/175 |
| 2013/0271226 A1* | 10/2013 | Sinoussi | .............. | H03B 5/1278 331/8 |

FOREIGN PATENT DOCUMENTS

WO    WO 03/088497 A1 * 10/2003  ............... H03L 7/14

* cited by examiner

*Primary Examiner* — Levi Gannon
(74) *Attorney, Agent, or Firm* — Schiff Hardin LLP

(57) ABSTRACT

A calibration circuit for calibrating a peak detector configured to detect a signal peak amplitude of an oscillator, including: a calibration oscillator configured to be supplied by at least two different supply voltages to generate respective calibration signals; a calibration peak detector configured to detect a calibration signal peak amplitude of each of the calibration signals; and a logic circuit configured to calibrate the peak detector based on the detected calibration signal peak amplitudes.

20 Claims, 4 Drawing Sheets

400
Differential Amplifier (optional)

500

PEAK DETECTOR CALIBRATION

BACKGROUND

Local oscillator performance may be impacted by phase noise. To alleviate phase noise, a system designer can modify the local oscillator topology, maximize the quality of passive components, and/or maximize the amplitude of oscillation. Once the oscillator topology is selected and the passive components designed, oscillation amplitude should be set to be as high as possible, but not exceed the reliability limit. If the reliability limit is exceeded, the impact of phase noise on oscillator performance over time will increase. And if the oscillation amplitude is not maximized, the phase noise itself will not be minimized.

A peak detector generally detects oscillation amplitude and produces a voltage proportional to it. However, a challenge of the peak detector is to have its transfer function from input oscillation amplitude to output voltage known over Process, Voltage, and Temperature (PVT) variations.

DETAILED DESCRIPTION

The present disclosure is directed to a peak detector coupled with a calibration circuit to enable the peak detector to sense amplitude of oscillation reliably over Process, Voltage, and Temperature (PVT) variations.

Figure 1:
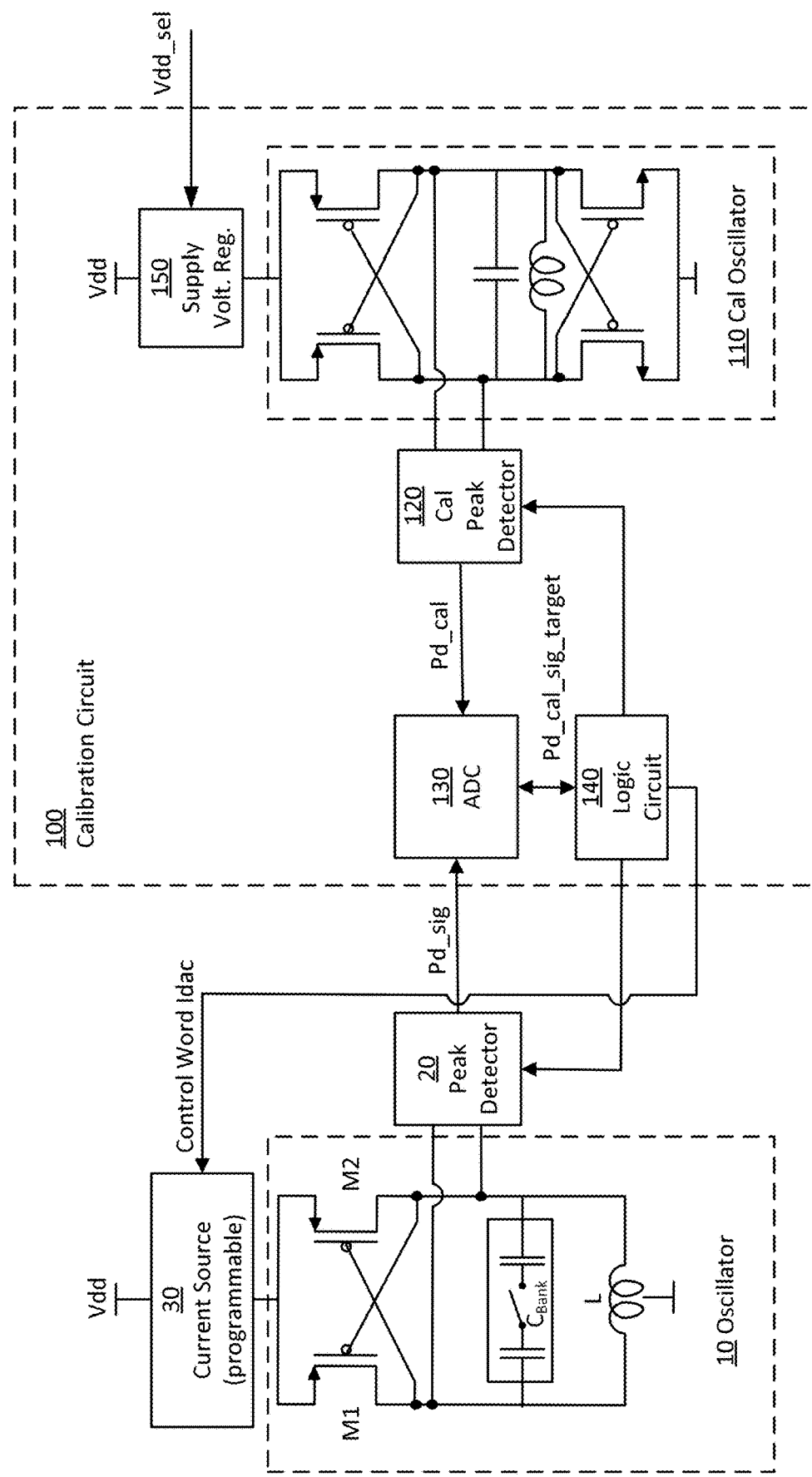
FIG. 1 illustrates a schematic diagram of a calibration circuit in accordance with aspects of the disclosure.

FIG. 1 illustrates a schematic diagram of a calibration circuit 100 in accordance with aspects of the disclosure.

The calibration circuit 100 is coupled to an oscillator 10 with its peak detector 20 and current source 30. The calibration circuit 100 is configured to calibrate the peak detector 20. The oscillator 10 may be referred to as main oscillator 10 and the peak detector 20 may be referred to as main peak detector 20.

The main oscillator 10 is configured to generate a signal. This signal may be referred to as an oscillating signal. In some embodiments, the main oscillator 10 is implemented in an RF system generating RF signals above 1 GHz, for example, signals in a mm wave band, such as the V band or the W band. The main oscillator 10 has a resonant tank including an inductor L and capacitor $C_{Bank}$. The peak detector 20 is configured to detect a signal peak amplitude Pd_sig of the signal generated by the main oscillator 10. The current source 30, which is programmable, is configured to supply current to the main oscillator 10.

The calibration circuit 100 comprises a calibration oscillator 110, a calibration peak detector 120, an Analog-to-Digital Converter (ADC) 130, a logic circuit 140, and a supply voltage regulator 150. The calibration circuit 100 is configured to calibrate the main peak detector 20 by determining a gain of its calibration peak detector 120. By using only internal components, the calibration circuit 100 achieves calibration without the need for supplying an external oscillation signal. This saves a pad for an external calibration oscillator signal and in addition increases the accuracy of the calibration.

The supply voltage regulator 150 is configured to generate different supply voltages. The supply voltage regulator 150 may be, for example, a Low Drop Out (LDO) regulator to generate the different supply voltages based on a selected signal Vdd_sel at its select terminal. The supply voltage regulator 150 is not limited to being a LDO regulator, but may be any supply voltage regulator that is suitable for the intended purpose.

The calibration oscillator 110 is configured to be supplied by the supply voltage regulator 150 with at least two different supply voltages (e.g., Vdd1 and Vdd2), and generate respective calibration signals. Since there is no current source for the calibration oscillator 110, the calibration oscillator 110 oscillates with a well-defined amplitude (e.g., Vdd1 and Vdd2) depending on the select signal Vdd_sel.

The calibration oscillator 110 may comprise a Complementary Metal Oxide Semiconductor (CMOS) oscillator, an inductor capacitor based oscillator, a ring oscillator, or the like. The calibration oscillator 110 may have any topology such as p-only, n-only, pn, resistive/current-biased, etc. A preferred topology of the calibration oscillator is pn to generate a signal having a well-defined oscillation amplitude equal to the supply voltage.

The calibration oscillator 110 and the oscillator 10 may be the same oscillator type. Alternatively, the calibration oscillator 110 and the oscillator 10 may be different oscillator types in order to provide a more precise calibration. For example, the oscillator 10 may be a high-performance oscillator, and the calibration oscillator 110 a lower-performance oscillator.

The calibration peak detector 120 is configured to detect a calibration signal peak amplitude Pd_cal of each of the generated calibration signals. The calibration peak detector 120 is ideally a replica of the peak detector 20. The calibration peak detector 120 and the peak detector 20 may be laid out close to each other in order to achieve better matching. In addition or alternatively, matching techniques may be used to implement calibration peak detector 120 and the peak detector 20. Since the calibration peak detector 120 and main peak detector 20 are the same, once the gain of the calibration peak detector 120 is determined, as will be described in more detail below, the gain of the main peak detector 20 is known. In some embodiments, the calibration oscillator 110 and oscillator 10 are laid out far away (at least geometrically separated more than the calibration peak detectors 20 and 120 are separated) to reduce mutual influences. A lay-out in which peak detector 20 is close to oscillator 10 and calibration peak detector 120 is close to calibration oscillator 110 allows having peak detector 20 and calibration peak detector 120 to be close while still separating oscillators 10 and 110 far enough to reduce mutual influence.

Further, the calibration peak detector 120 may comprise or be coupled to a memory (not shown). This memory may have a lookup table configured to store the detected calibration signal peak amplitudes Pd_cal.

The ADC 130 is coupled to both the peak detector 20 and the calibration peak detector 120. The ADC 130 is configured to sample and convert outputs of the calibration peak detector 120 and the peak detector 20, and then provide the sampled and converted outputs to the logic circuit 140.

The logic circuit 140 is configured to calibrate the peak detector 20 based on the detected calibration signal peak amplitudes. More specifically, the logic circuit 140 is configured to determine a gain of the calibration peak detector 120 based on an interpolation of the detected calibration signal peak amplitudes, as described below and illustrated in FIG. 2; the logic circuit 140 is then configured to calibrate the peak detector 20 based on the determined gain.

Further, the logic circuit 140 is configured to adjust a control word Idac of the programmable current source 30, based on the detected signal peak amplitude of the oscillator 10, to control the signal peak amplitude of the oscillator 10. Further, the logic circuit 140 may provide digital control signals, for example, turn on/turn off signals, to the peak detector 20, to the calibration peak detector 120, and/or to the ADC 130. The logic circuit 140 may be a digital logic circuit.

Figure 2:
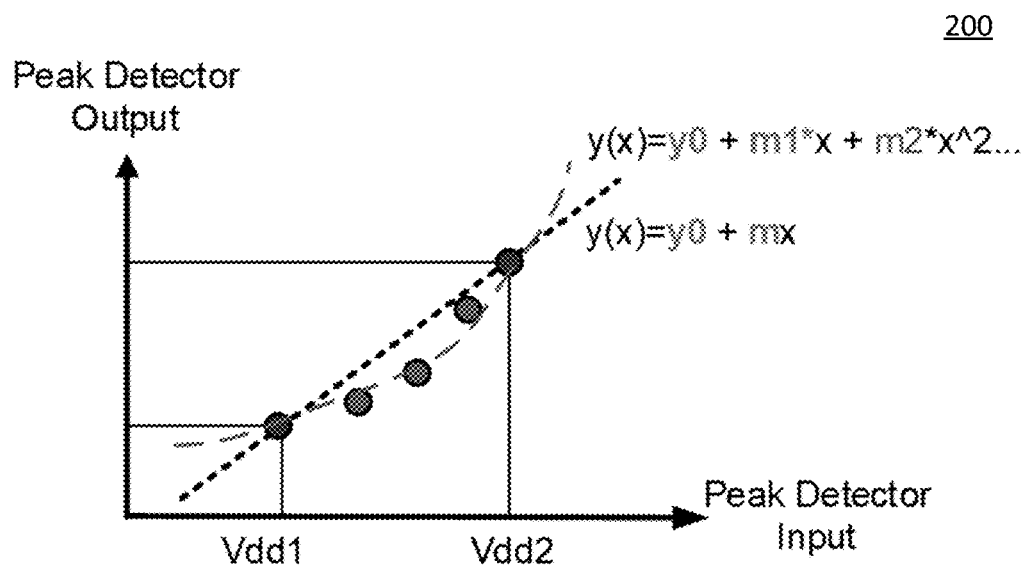
FIG. 2 illustrates a graph of peak detector input versus peak detector output in accordance with aspects of the disclosure.

FIG. 2 illustrates a graph 200 of peak detector input versus peak detector output in accordance with aspects of the disclosure.

In the case where the supply voltage regulator 112 supplies the calibration oscillator 110 with two different supply voltages (Vdd1 and Vdd2), the calibration peak detector 120 detects a calibration signal peak amplitude for each of these supply voltages. The logic circuit 140 interpolates these two calibration signal peak amplitudes to derive a transfer function of a gain of the calibration peak detector 120 as linear. This linear transfer function is shown in the graph as a dotted, straight line.

When the supply voltage regulator 150 supplies the calibration oscillator with more than two different supply voltages, the calibration peak detector 120 detects a calibration signal peak amplitude for each of these supply voltages. The logic circuit 140 interpolates these more than two calibration signal peak amplitudes to derive a transfer function of a gain of the calibration peak detector 120 that may be nonlinear, and which is more precise. This nonlinear transfer function is shown in the graph as a dashed, curved line.

Figure 3:
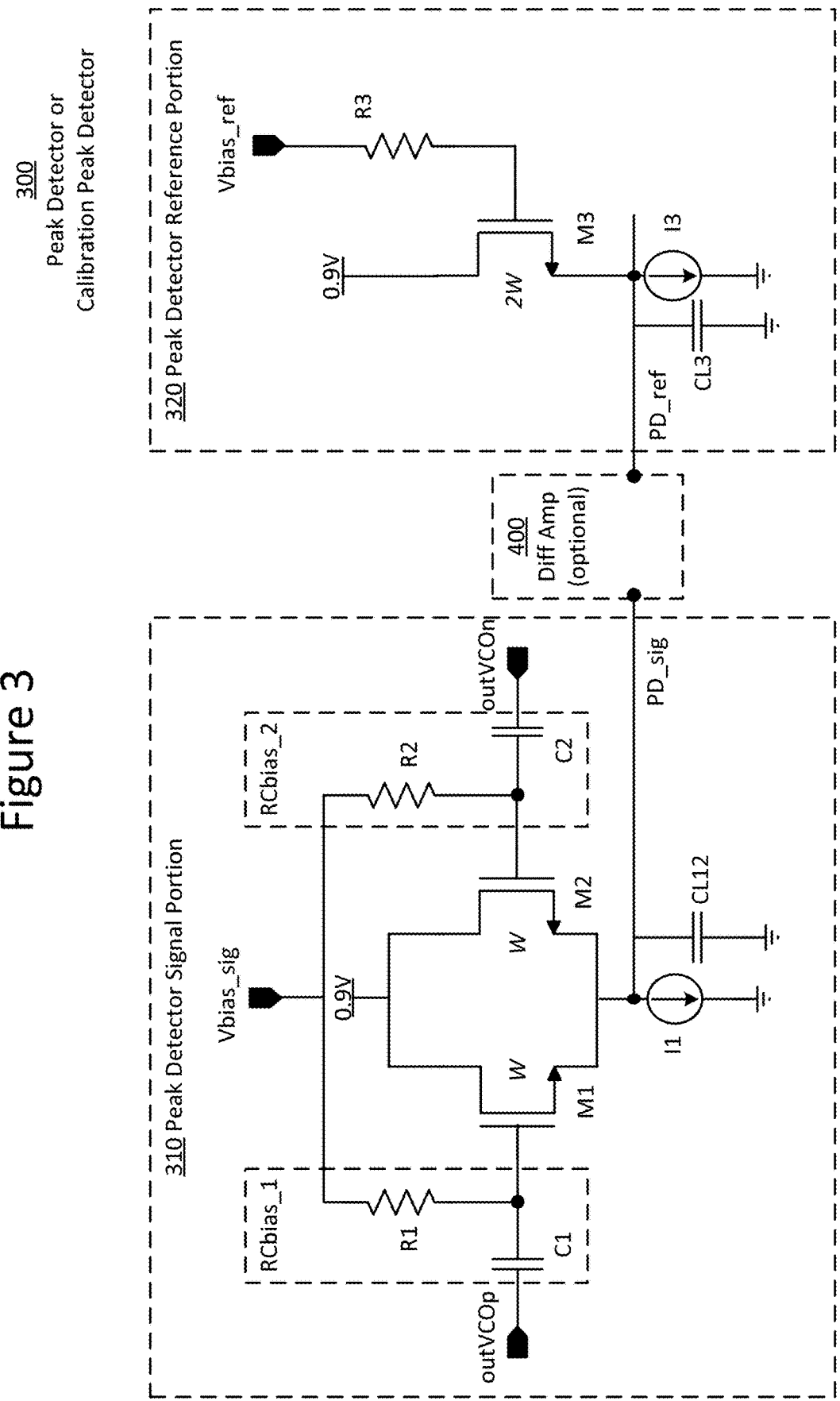
FIG. 3 illustrates a schematic diagram of a peak detector.

FIG. 3 illustrates a schematic diagram of a peak detector 300. This peak detector 300 may be the peak detector 20 and/or the calibration peak detector 120. The structure of the peak detector 300 shown is merely an example and not meant to be limiting.

The peak detector 300 comprises a peak detector signal portion 310 and a peak detector reference portion 320.

The peak detector signal portion 310 comprises transistors M1, M2, resistor-capacitor bias tees RCbias_1, RCbias_2, and a capacitor CL12. Resistor capacitor bias tee RCbias_1 is comprised of resistor R1 and capacitor C1, and resistor capacitor bias tee RCbias_2 is comprised of resistor R2 and capacitor C2. The transistors M1, M2 have their respective gates coupled to oscillator outputs outVCOp, outVCOn. The transistors M1, M2 rectify the input voltage outVCOp, outVCOn over the capacitance CL12. The resistor capacitor bias tees RCbias_1, RCbias_2 bias the respective transistors M1, M2. Due to nonlinearities of the transistors M1, M2, the amplitude of the oscillation is collected as a current in the capacitor CL12, and this capacitor current increases the voltage PD_sig as the oscillator amplitude increases.

The peak detector reference portion 320 is employed as a reference and thus has no input. When the oscillator 10 is off and has zero amplitude, the voltage PD_sig of the peak detector signal portion 310 is equal to the reference voltage PD_ref of the peak detector reference portion 320. The peak detector reference portion 320 comprises transistor M3, which has twice the channel width of the transistors M1, M2 (2W versus W).

If current I1, current I3, capacitor CL12, capacitor CL3 and the characteristic of the transistors M1, M2, and M3 are well defined and known, there is a direct correlation between the oscillation amplitude and the peak detector output voltage (Pd_sig-Pd_ref).

Figure 4:
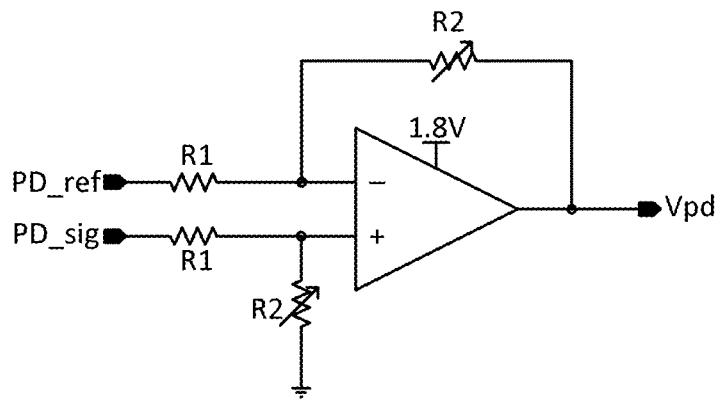
FIG. 4 illustrates a schematic diagram of a differential amplifier.

FIG. 4 illustrates a schematic diagram of an optional differential amplifier 400, which is also shown in FIG. 3 coupled between the peak detector signal portion 310 and the peak detector reference portion 320. The differential amplifier 400 is configured to amplify a difference between the voltages output by the peak detector signal portion 310 and the peak detector reference portion 320, that is, the voltage PD_sig and the reference voltage PD_ref, to output the signal peak amplitude voltage Vpd. Differential amplifiers are known, and thus for the sake of brevity, a more detailed description is omitted here.

Figure 5:
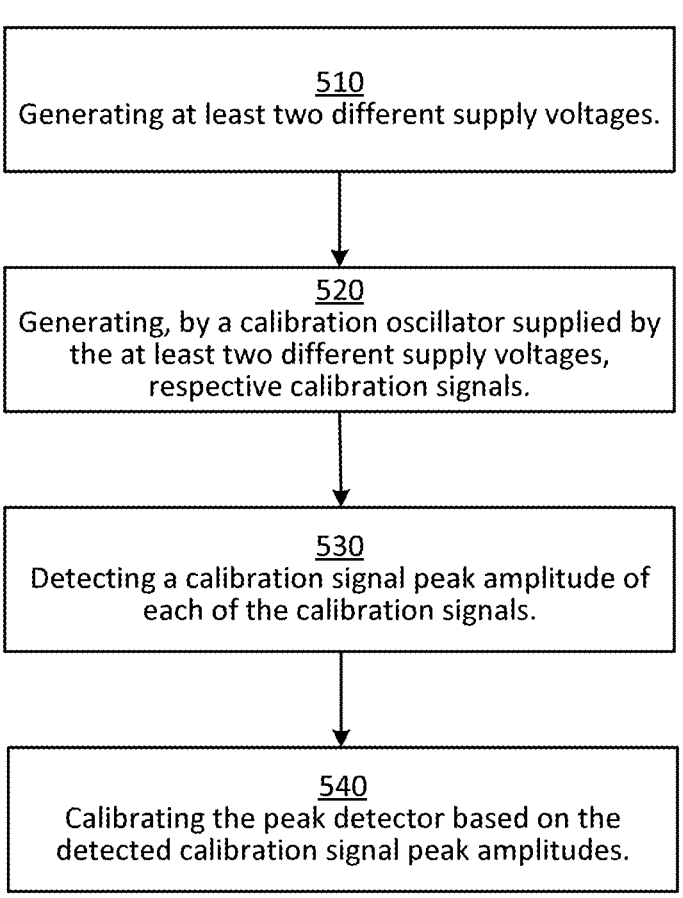
FIG. 5 illustrates a flowchart of a calibration method in accordance with aspects of the disclosure.

FIG. 5 illustrates a flowchart 500 of a calibration method for calibrating a peak detector 20 configured to detect a signal peak amplitude of an oscillator 10 in accordance with aspects of the disclosure.

At Step 510, generating at least two different supply voltages.

At Step 520, generating, by a calibration oscillator 110 supplied by the at least two different supply voltages, respective calibration signals.

At Step 530, detecting a calibration signal peak amplitude Pd_cal of each of the calibration signals.

At Step 540, calibrating the peak detector 20 based on the detected calibration signal peak amplitudes Pd_cal.

A more detailed description of this calibration method follows for the case where the peak detector gain has a transfer function that is linear.

First, the calibration oscillator 110 is turned on. The supply voltage regulator 150 sets the supply voltage to Vdd1. Since the calibration oscillator 110 is a rail-to-rail sinusoid, the amplitude of the calibration peak detector input signal is well defined as Vdd1. The ADC 130 samples the output signal PD_Vdd1 of the calibration peak detector 120.

Next, the supply voltage regulator 150 sets the supply voltage to Vdd2. Since the calibration oscillator 110 is a rail-to-rail sinusoid, the amplitude of the peak detector input signal is well defined as Vdd2. The ADC 130 samples the output signal PD_Vdd2 of the calibration peak detector 120.

The logic circuit 140 calculates the gain of the calibration peak detector 120 by interpolating the two calibration peak detector output versus input points at supply voltages Vdd1 and Vdd2. More specifically, the logic circuit 140 determines the slope m and the peak detector output point y0, as shown in FIG. 2. The gain of the peak detector 20 is the same as the gain of the calibration peak detector 120.

Next, the calibration oscillator 110 and the calibration peak detector 120 may be turned off and the main oscillator 10 turned on. The main peak detector 20 reads the amplitude of oscillation of the main oscillator 10. The ADC 130 samples the main oscillator's output voltage Pd_sig, and the logic circuit 140 generates the real amplitude, that is, the calibrated output amplitude of the main oscillator output voltage PD_sig, using the slope m and peak detector output point y0. Once the real oscillation amplitude is known, the logic circuit 140 sets the main oscillator control word Idac in order to obtain the desired oscillation amplitude. This process loops until the desired amplitude of oscillation of the main oscillator 10 is obtained.

The calibration can be performed again in the background when an on-chip temperature sensor senses a predefined temperature change or a predefined supply voltage change.

The achieved calibration provides a precise gain of the peak detector 20 regardless of PVT variations, therefore being able to sense the oscillator output voltage amplitude with high accuracy and robustness.

The oscillator 10, the peak detector 20, the calibration oscillator 110, and the calibration peak detector 120 may be integrated on a same semiconductor chip.

The techniques of this disclosure may also be described in the following examples.

Example 1. A calibration circuit for calibrating a peak detector configured to detect a signal peak amplitude of an oscillator, comprising: a calibration oscillator configured to be supplied by at least two different supply voltages to generate respective calibration signals; a calibration peak detector configured to detect a calibration signal peak amplitude of each of the calibration signals; and a logic circuit configured to calibrate the peak detector based on the detected calibration signal peak amplitudes.

Example 2. The calibration circuit of example 1, wherein the logic circuit is configured to determine a gain of the calibration peak detector based on an interpolation of the detected calibration signal peak amplitudes, and calibrate the peak detector based on the determined gain.

Example 3. The calibration circuit of any combination of examples 1-2, further comprising: an analog-to-digital converter configured to sample and convert outputs of the calibration peak detector and the peak detector and provide the sampled and converted outputs to the logic circuit.

Example 4. The calibration circuit of any combination of examples 1-3, wherein the calibration peak detector is a replica of the peak detector.

Example 5. The calibration circuit of any combination of examples 1-4, wherein the calibration oscillator is an inductor capacitor based oscillator.

Example 6. The calibration circuit of any combination of examples 1-5, further comprising: a supply voltage regulator configured to generate the at least two different supply voltages.

Example 7. The calibration circuit of any combination of examples 1-6, wherein the supply voltage regulator is configured to supply the calibration oscillator with two different supply voltages to derive a linear transfer function of a gain of the calibration peak detector.

Example 8. The calibration circuit of any combination of examples 1-7, wherein the supply voltage regulator is configured to supply the calibration oscillator with more than two different supply voltages to derive a nonlinear transfer function of a gain of the calibration peak detector.

Example 9. The calibration circuit of any combination of examples 1-8, further comprising: a memory comprising a lookup table configured to store the detected calibration signal peak amplitudes.

Example 10. The calibration circuit of any combination of examples 1-9, wherein the oscillator and the calibration oscillator are of different oscillator types.

Example 11. The calibration circuit of any combination of examples 1-10, wherein the calibration oscillator comprises a Complementary Metal Oxide Semiconductor (CMOS) oscillator, an inductor capacitor based oscillator, or a ring oscillator.

Example 12. The calibration circuit of any combination of examples 1-11, wherein the logic circuit is configured to adjust a control word of a programmable current source of the oscillator to control the signal peak amplitude of the oscillator.

Example 13. An oscillator circuit, comprising: an oscillator configured to generate a signal; a peak detector configured to detect a signal peak amplitude of a signal of the oscillator; a supply voltage regulator configured to generate at least two different supply voltages; a calibration oscillator configured to be supplied by the at least two different supply voltages to generate respective calibration signals; a calibration peak detector configured to detect a calibration signal peak amplitude of each of the calibration signals; and a logic circuit configured to determine a gain of the calibration peak detector based on an interpolation of the detected calibration signal peak amplitudes, and calibrate the oscillator through the peak detector based on the determined gain.

Example 14. The oscillator circuit of any combination of examples 13, wherein the oscillator, the peak detector, the calibration oscillator and the calibration peak detector are integrated on a same semiconductor chip.

Example 15. The oscillator circuit of any combination of examples 13, further comprising: an analog-to-digital converter configured to sample and convert outputs of the calibration peak detector and the peak detector and provide the sampled and converted outputs to the logic circuit.

Example 16. The oscillator circuit of any combination of examples 13, further comprising: a programmable current source configured to supply current to the oscillator, wherein the logic circuit is configured to adjust a control word of the programmable current source based on the detected signal peak amplitude of the oscillator.

Example 17. A calibration method for calibrating a peak detector configured to detect a signal peak amplitude of an oscillator, the calibration method comprising: generating at least two different supply voltages; generating, by a calibration oscillator supplied by the at least two different supply voltages, respective calibration signals; detecting a calibration signal peak amplitude of each of the calibration signals; and calibrating the peak detector based on the detected calibration signal peak amplitudes.

Example 18. The calibration method of any combination of examples 17, further comprising: sampling and converting outputs of the calibration peak detector.

Example 19. The calibration method of any combination of examples 17, further comprising: supplying the calibration oscillator with more than two different supply voltages; and deriving a nonlinear transfer function of a gain of a calibration peak detector.

Example 20. The calibration method of any combination of examples 17, further comprising: adjusting a control word of a programmable current source of the oscillator to control the signal peak amplitude of the oscillator.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A calibration circuit for calibrating a peak detector configured to detect a signal peak amplitude of an oscillator, comprising:
  a calibration oscillator configured to be supplied by at least two different supply voltages to generate respective calibration signals;

a calibration peak detector configured to detect a calibration signal peak amplitude of each of the calibration signals; and a logic circuit configured to calibrate the peak detector based on the detected calibration signal peak amplitudes.

2. The calibration circuit of claim 1, wherein the logic circuit is configured to determine a gain of the calibration peak detector based on an interpolation of the detected calibration signal peak amplitudes, and calibrate the peak detector based on the determined gain.

3. The calibration circuit of claim 1, further comprising:
an analog-to-digital converter configured to sample and convert outputs of the calibration peak detector and the peak detector and provide the sampled and converted outputs to the logic circuit.

4. The calibration circuit of claim 1, wherein the calibration peak detector is a replica of the peak detector.

5. The calibration circuit of claim 1, wherein the calibration oscillator is an inductor capacitor based oscillator.

6. The calibration circuit of claim 1, further comprising:
a supply voltage regulator configured to generate the at least two different supply voltages.

7. The calibration circuit of claim 6, wherein the supply voltage regulator is configured to supply the calibration oscillator with two different supply voltages to derive a linear transfer function of a gain of the calibration peak detector.

8. The calibration circuit of claim 6, wherein the supply voltage regulator is configured to supply the calibration oscillator with more than two different supply voltages to derive a nonlinear transfer function of a gain of the calibration peak detector.

9. The calibration circuit of claim 1, further comprising:
a memory comprising a lookup table configured to store the detected calibration signal peak amplitudes.

10. The calibration circuit of claim 1, wherein the oscillator and the calibration oscillator are of different oscillator types.

11. The calibration circuit of claim 1, wherein the calibration oscillator comprises a Complementary Metal Oxide Semiconductor (CMOS) oscillator, an inductor capacitor based oscillator, or a ring oscillator.

12. The calibration circuit of claim 1, wherein the logic circuit is configured to adjust a control word of a programmable current source of the oscillator to control the signal peak amplitude of the oscillator.

13. An oscillator circuit, comprising:
an oscillator configured to generate a signal;
a peak detector configured to detect a signal peak amplitude of a signal of the oscillator;
a supply voltage regulator configured to generate at least two different supply voltages;

a calibration oscillator configured to be supplied by the at least two different supply voltages to generate respective calibration signals;
a calibration peak detector configured to detect a calibration signal peak amplitude of each of the calibration signals; and
a logic circuit configured to determine a gain of the calibration peak detector based on an interpolation of the detected calibration signal peak amplitudes, and calibrate the oscillator through the peak detector based on the determined gain.

14. The oscillator circuit of claim 13, wherein the oscillator, the peak detector, the calibration oscillator and the calibration peak detector are integrated on a same semiconductor chip.

15. The oscillator circuit of claim 13, further comprising:
an analog-to-digital converter configured to sample and convert outputs of the calibration peak detector and the peak detector and provide the sampled and converted outputs to the logic circuit.

16. The oscillator circuit of claim 13, further comprising:
a programmable current source configured to supply current to the oscillator,
wherein the logic circuit is configured to adjust a control word of the programmable current source based on the detected signal peak amplitude of the oscillator.

17. A calibration method for calibrating a peak detector configured to detect a signal peak amplitude of an oscillator, the calibration method comprising:
generating at least two different supply voltages;
generating, by a calibration oscillator supplied by the at least two different supply voltages, respective calibration signals;
detecting a calibration signal peak amplitude of each of the calibration signals; and
calibrating the peak detector based on the detected calibration signal peak amplitudes.

18. The calibration method of claim 17, further comprising:
sampling and converting outputs of the calibration peak detector.

19. The calibration method of claim 17, further comprising:
supplying the calibration oscillator with more than two different supply voltages; and
deriving a nonlinear transfer function of a gain of a calibration peak detector.

20. The calibration method of claim 17, further comprising:
adjusting a control word of a programmable current source of the oscillator to control the signal peak amplitude of the oscillator.

* * * * *